(12) United States Patent
Dahl et al.

(10) Patent No.: US 7,091,083 B2
(45) Date of Patent: Aug. 15, 2006

(54) METHOD FOR PRODUCING A CAPACITOR

(75) Inventors: Claus Dahl, Dresden (DE); Knut Stahrenberg, Dresden (DE); Christoph Wilbertz, Gundelfingen (DE)

(73) Assignee: Infineon Technologies AG, Munich (DE)

(*) Notice: Subject to any disclaimer, the term of this patent is extended or adjusted under 35 U.S.C. 154(b) by 0 days.

(21) Appl. No.: 10/888,574

(22) Filed: Jul. 9, 2004

(65) Prior Publication Data

US 2005/0037591 A1 Feb. 17, 2005

Related U.S. Application Data

(63) Continuation of application No. PCT/EP03/00184, filed on Jan. 10, 2003.

(30) Foreign Application Priority Data

Jan. 11, 2002 (DE) .............................. 102 00 838

(51) Int. Cl.
*H01L 21/8242* (2006.01)

(52) U.S. Cl. ...................... 438/250; 438/210; 438/251; 438/393; 438/394

(58) Field of Classification Search ................ 438/210, 438/239, 250, 251, 393, 394, FOR. 220, 438/FOR. 430
See application file for complete search history.

(56) References Cited

U.S. PATENT DOCUMENTS

| | | | |
|---|---|---|---|
| 5,391,905 A | 2/1995 | Yamazaki | |
| 6,096,600 A | 8/2000 | Azami | |
| 6,303,455 B1 | 10/2001 | Hou et al. | |
| 6,670,228 B1 | 12/2003 | Coolbaugh et al. | |
| 6,686,213 B1* | 2/2004 | Trimberger | 438/14 |
| 2001/0009785 A1 | 7/2001 | Arafa et al. | |
| 2002/0045322 A1* | 4/2002 | Meikle et al. | 438/381 |
| 2002/0195669 A1* | 12/2002 | Morihara et al. | 257/390 |
| 2003/0141534 A1 | 7/2003 | Coolbaugh et al. | |

FOREIGN PATENT DOCUMENTS

| | | |
|---|---|---|
| DE | 101 07 012 A | 9/2001 |
| JP | 11274415 A | 10/1999 |
| JP | 2000156467 | 6/2000 |
| WO | WO 00/54319 A | 9/2000 |

\* cited by examiner

*Primary Examiner*—George Fourson
*Assistant Examiner*—Joannie Adelle García
(74) *Attorney, Agent, or Firm*—Maginot, Moore & Beck

(57) ABSTRACT

A method for producing a capacitor comprises providing a raw structure having a substrate and at least one dielectric layer, wherein a first area and a second area of the substrate are separated by an isolating layer. Above the first and second areas, an electrically conductive layer is arranged on the at least one dielectric layer. Further, a mask layer is deposited on the electrically conductive layer, wherein it is structured for generating a first mask above the first area. The method further comprises etching away the electrically conductive layer and at least one of the dielectric layers in the second area by means of the first mask and completing an active device in the second area.

25 Claims, 12 Drawing Sheets

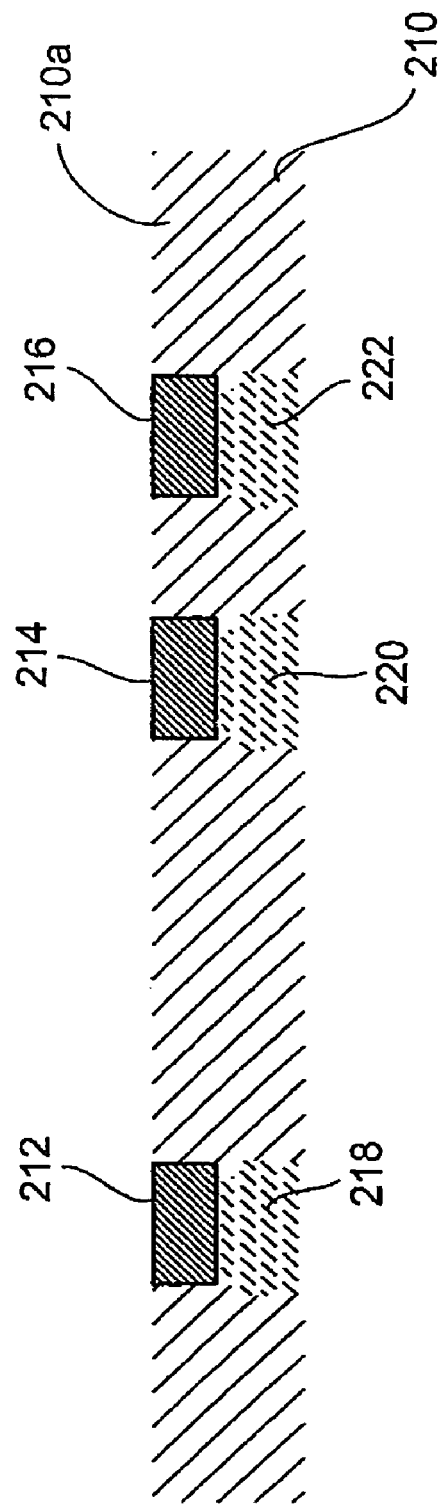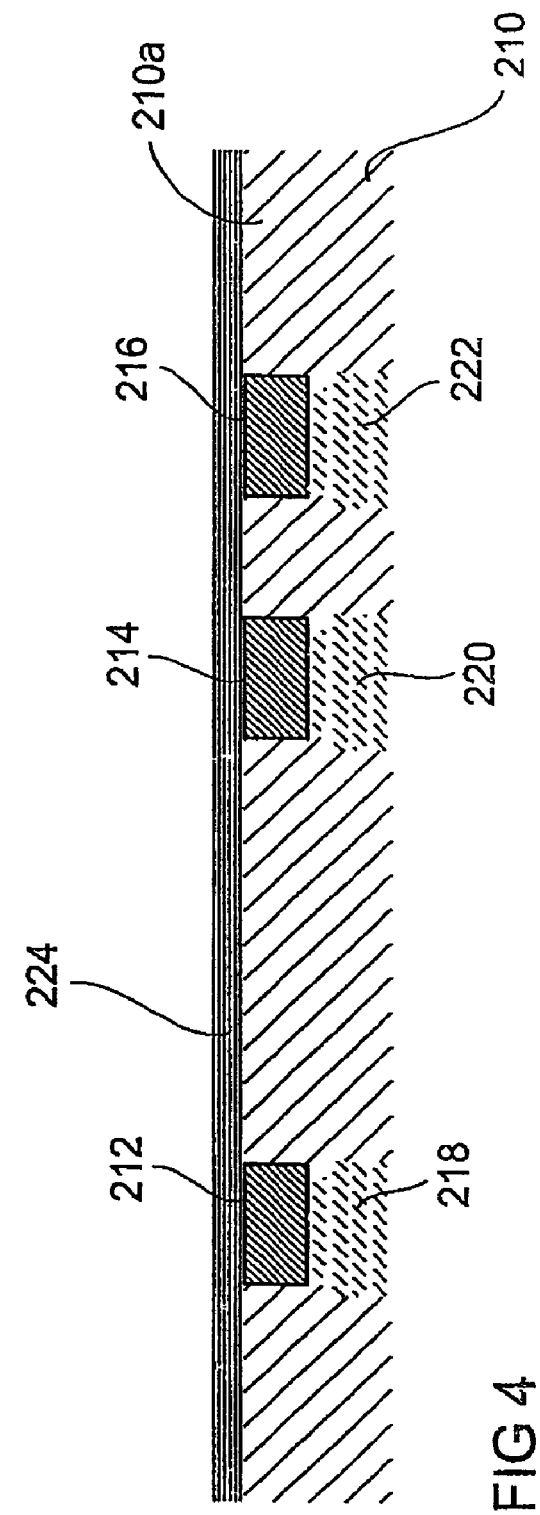

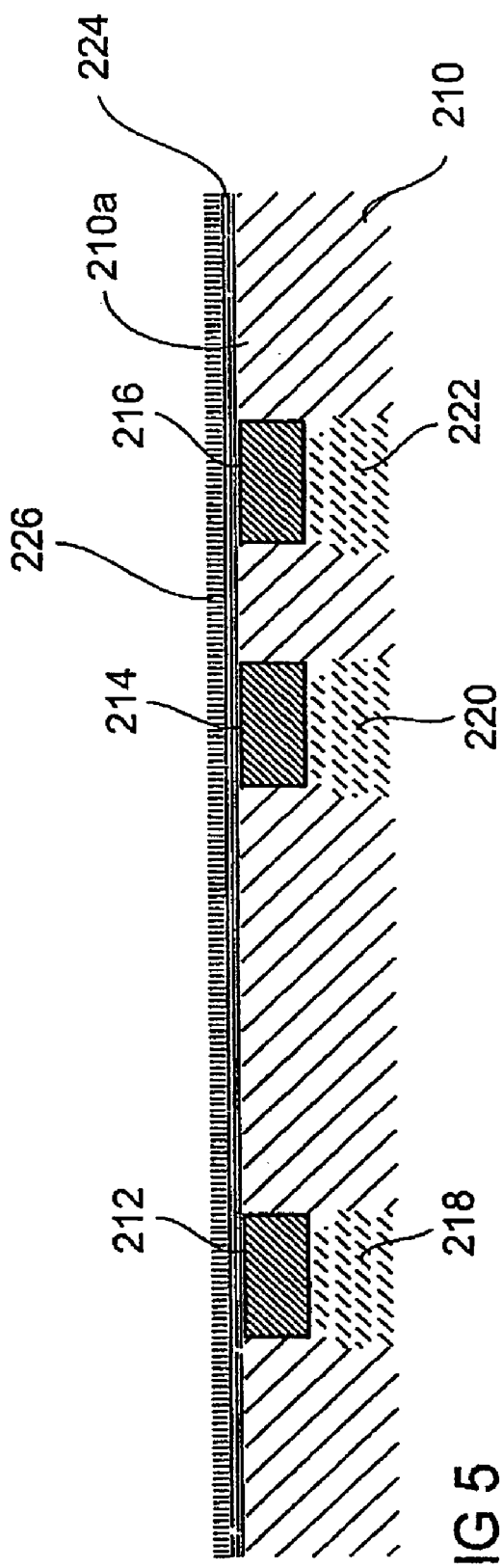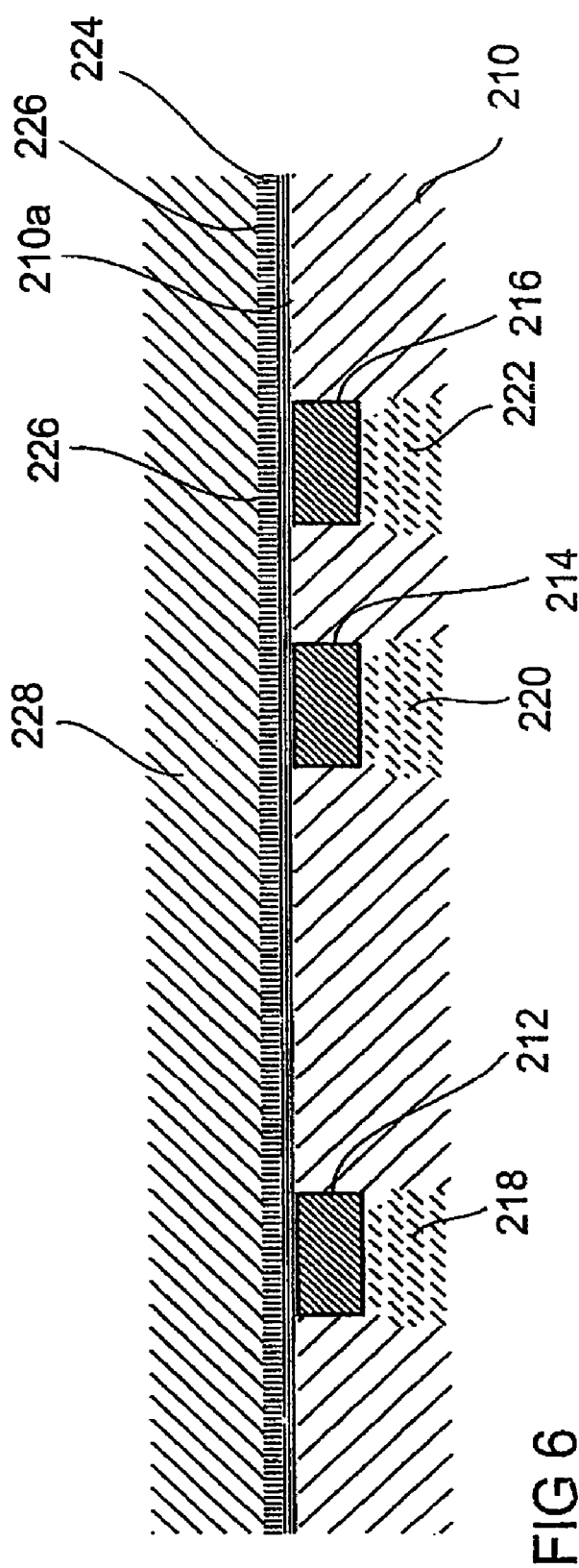

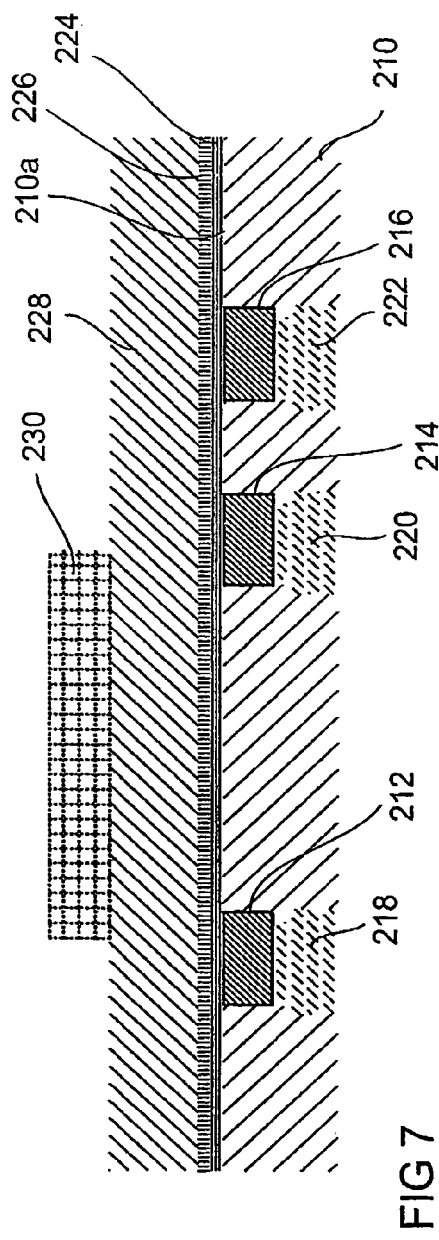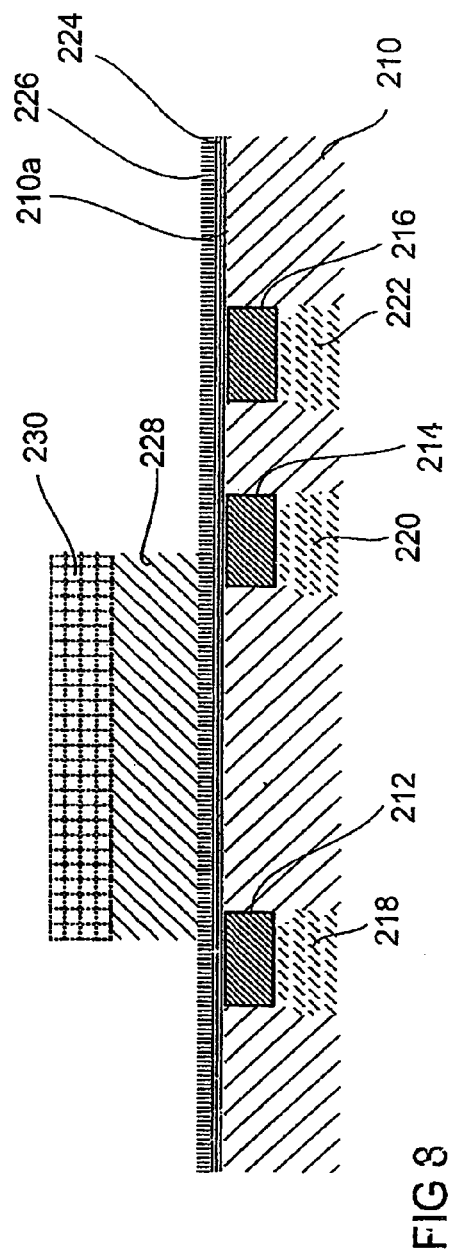

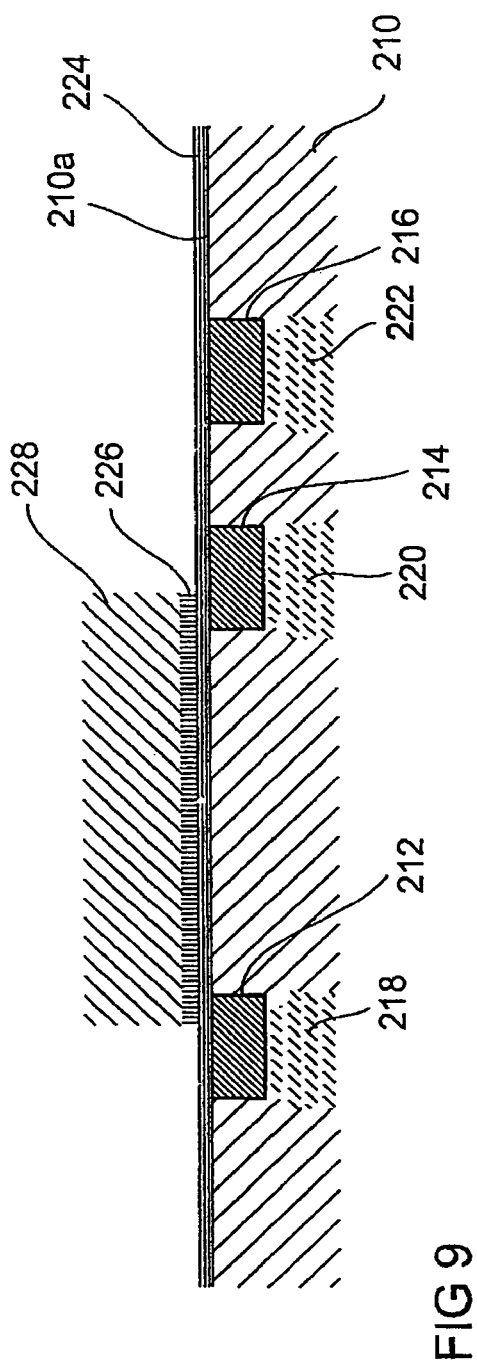
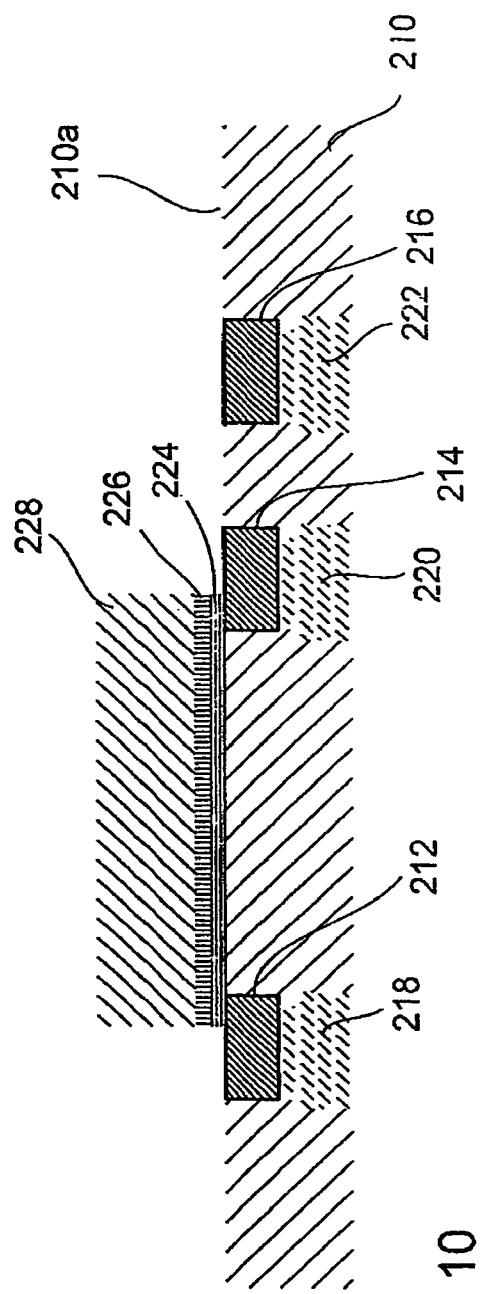

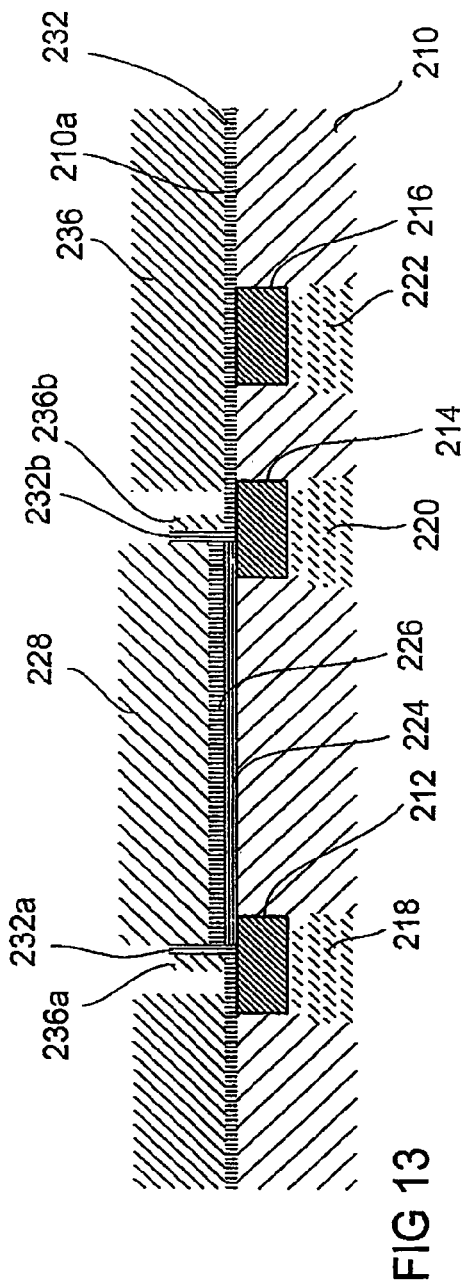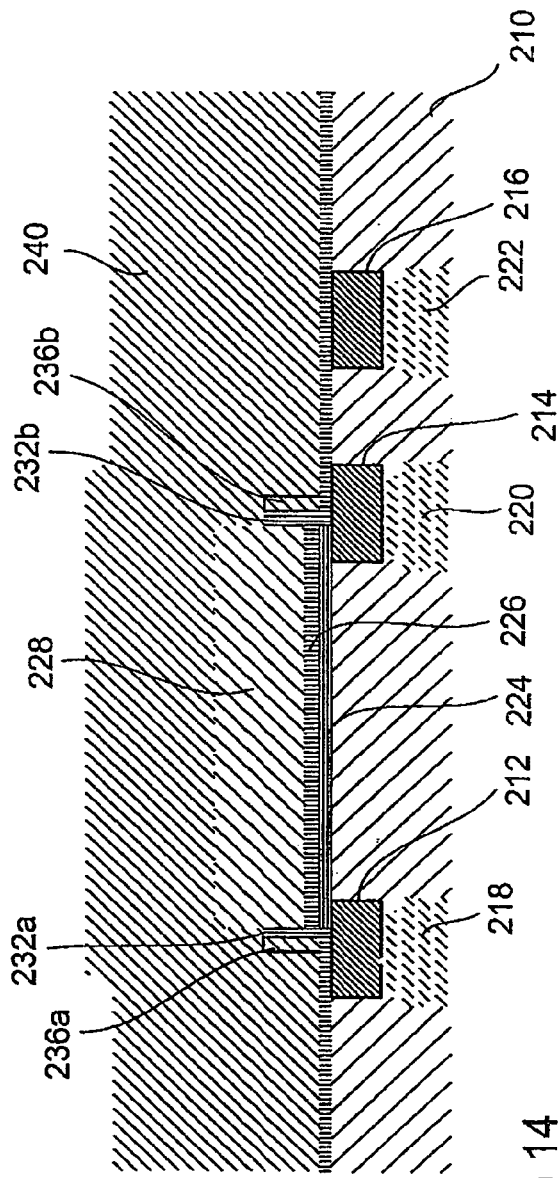

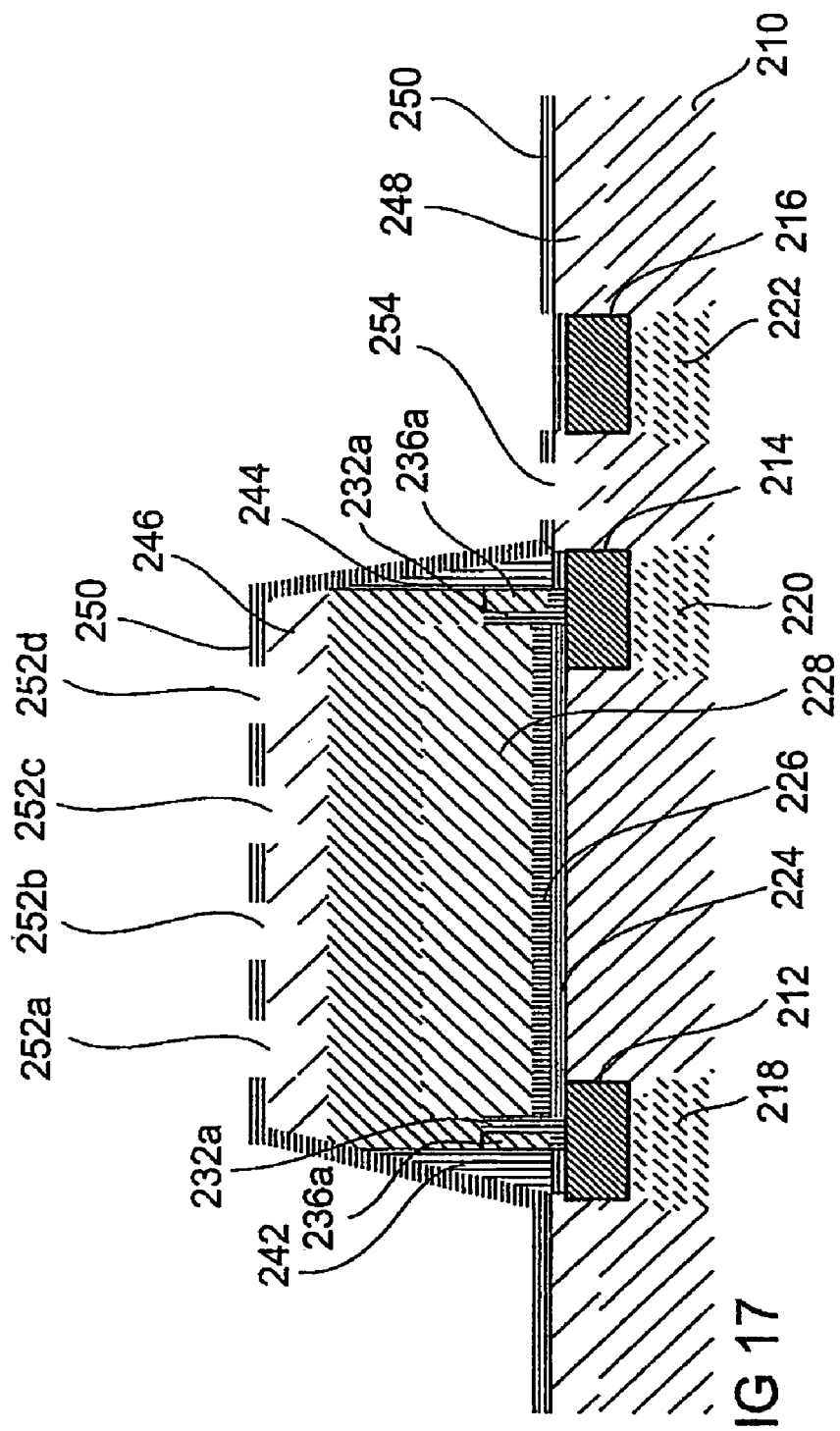

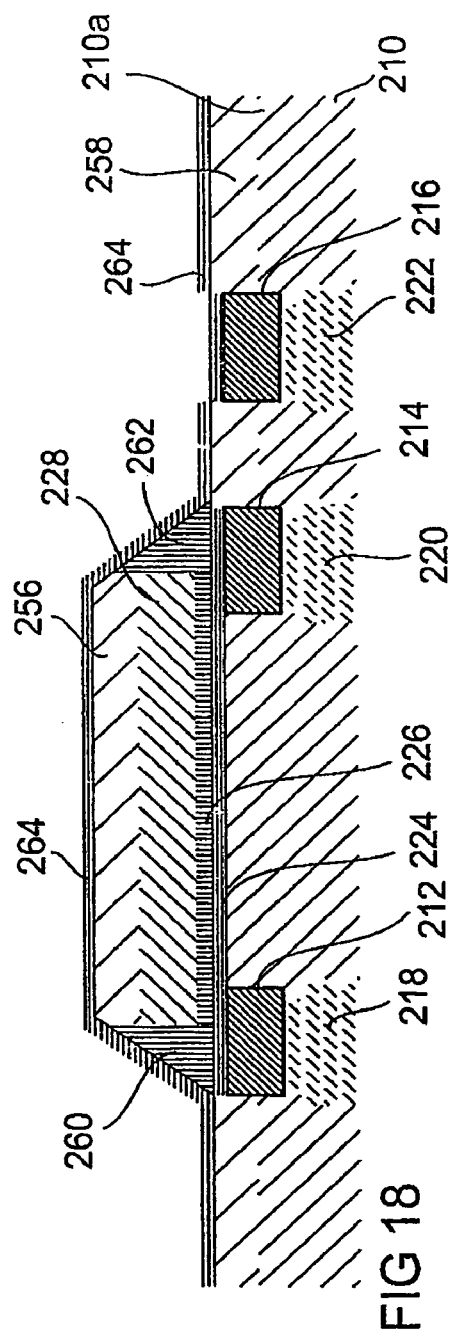
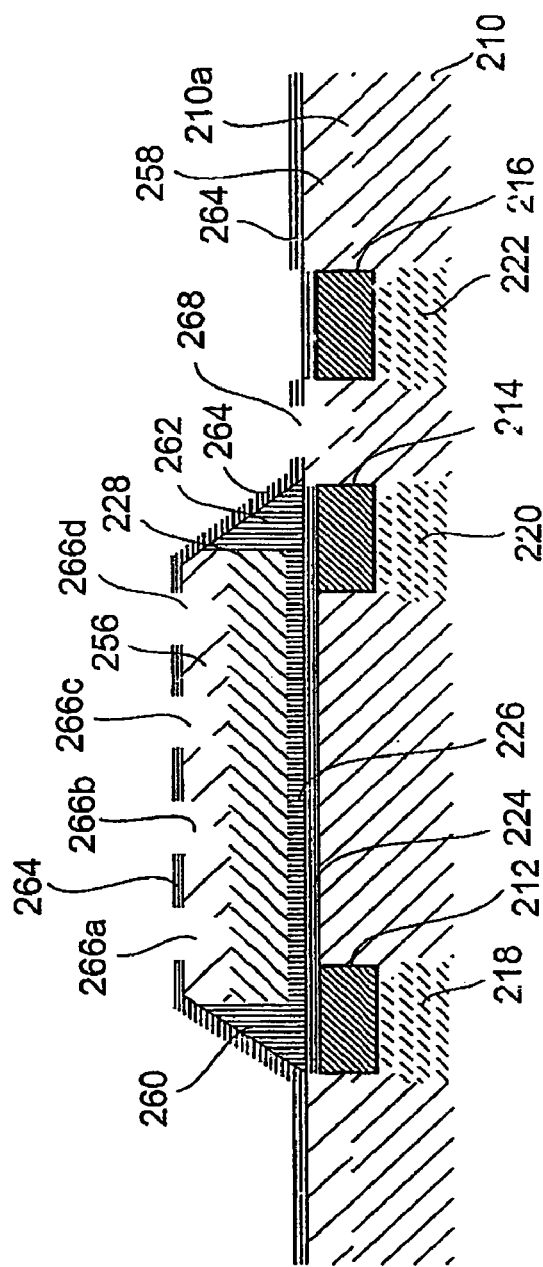

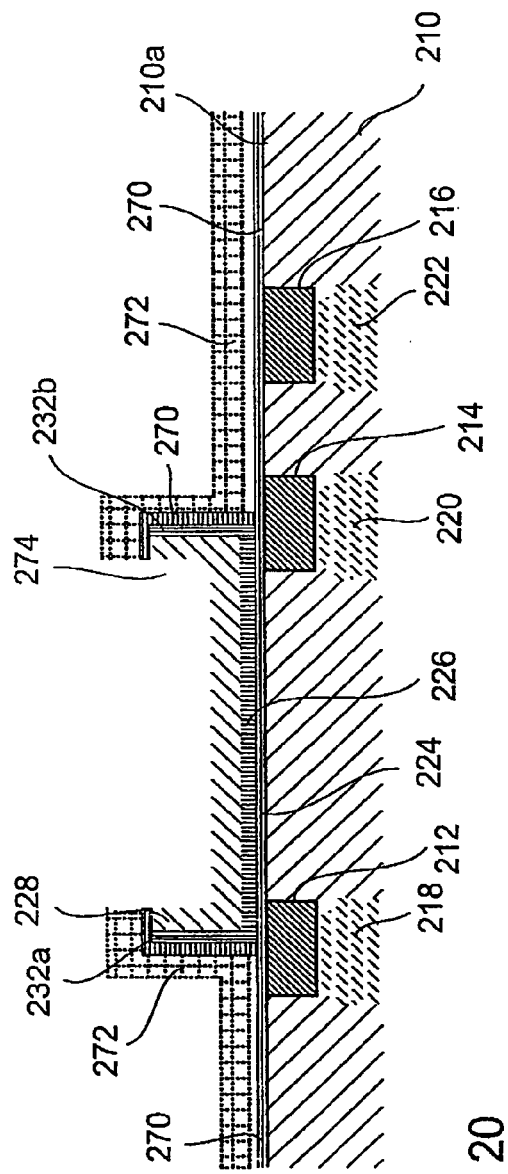
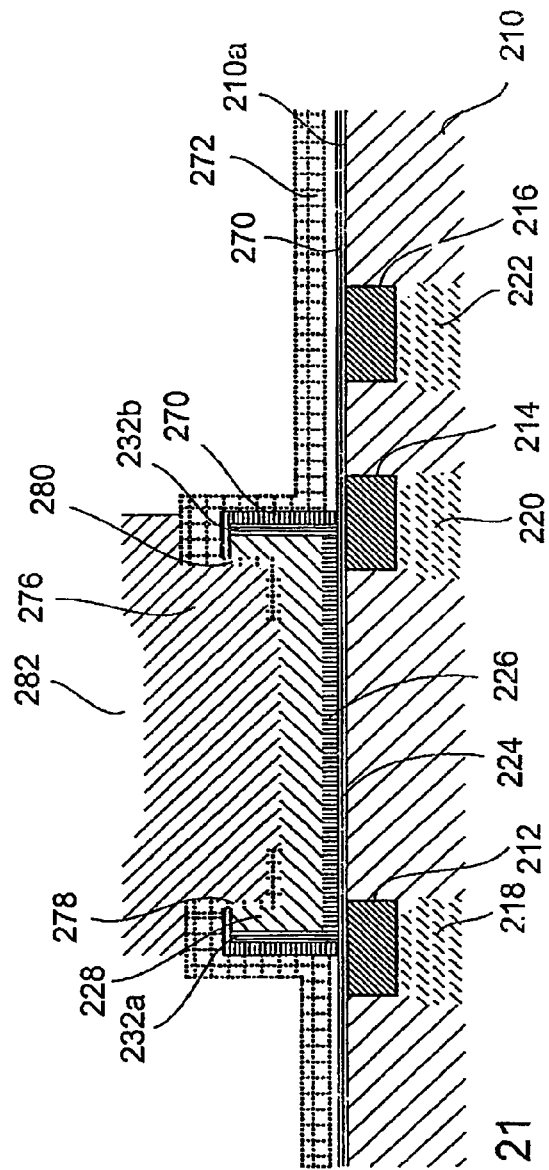

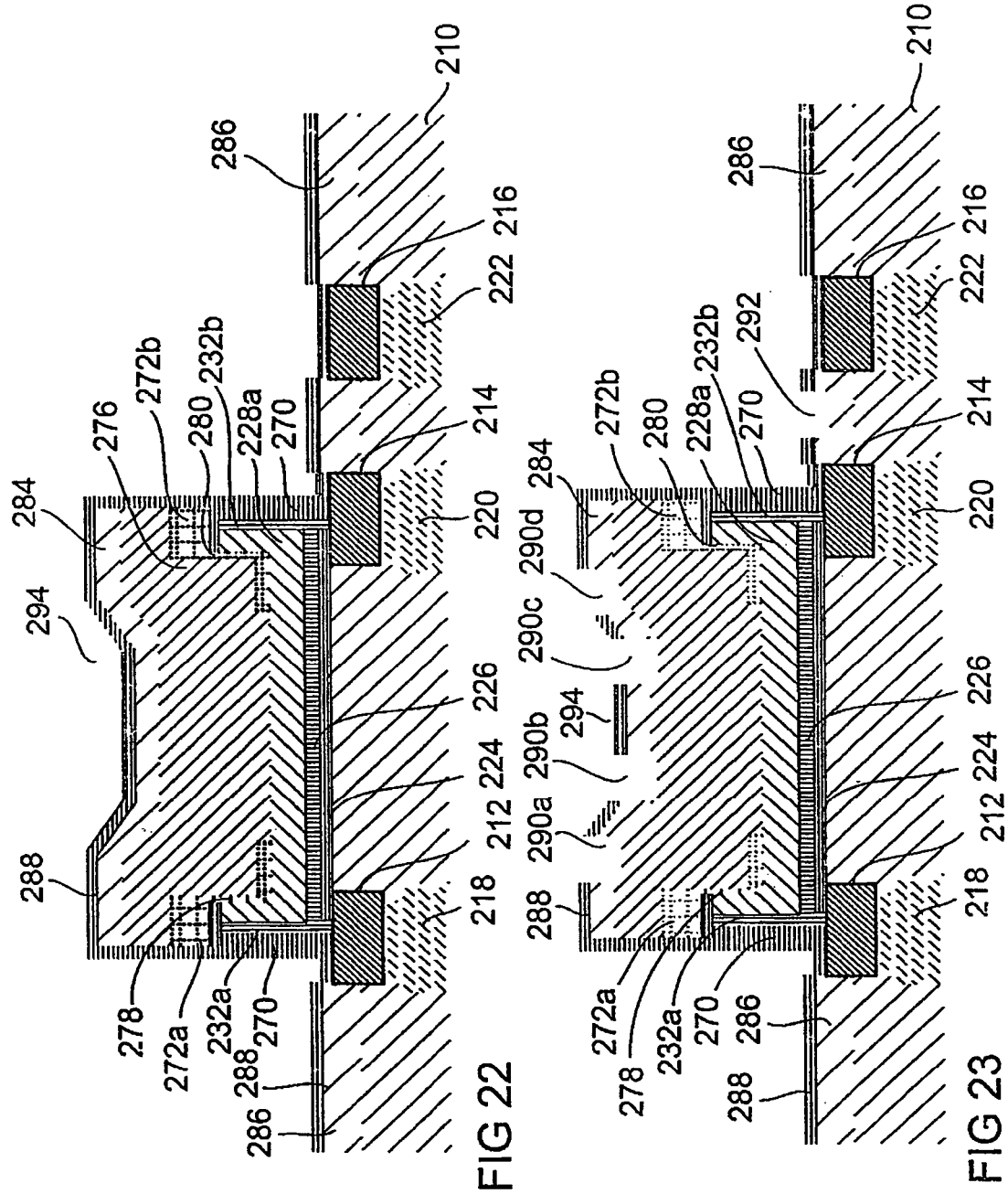

US 7,091,083 B2

METHOD FOR PRODUCING A CAPACITOR

CROSS-REFERENCE TO RELATED APPLICATION

This application is a continuation of copending International Application No. PCT/EP03/00184, filed Jan. 10, 2003, which designated China and the United States, was not published in English and is incorporated herein by reference in its entirety.

BACKGROUND OF THE INVENTION

1. Field of the Invention

The present invention refers to capacitors and particularly to integrated capacitors with silicon and polysilicon electrodes, respectively.

2. Description of Prior Art

Nowadays, integrated circuits are used in many applications and apparatuses, such as for wireless communication. In order to satisfy the high requirements, which are demanded nowadays with regard to a behavior of such apparatuses, the devices included therein must have a high quality.

The intermodulation factor and the harmonic distortion factor (klirr-factor) represent important parameters for the usage of an analogue circuit in a wireless communication apparatus. An integrated capacitor, which is, for example, used in such an analogue circuit for a wireless communication apparatus, should therefore have a very low dependency of the capacity on the applied voltage U to obtain the above-mentioned requirements of a high quality analogue circuit.

The capacitance curve C(U) is mainly determined by charge carrier concentrations of the two capacitor electrodes, wherein the charge carrier concentrations should be as high as possible. If, for example, an upper electrode is formed of a lightly n-doped semiconductor layer, applying positive voltages to this electrode can lead to a strong depletion of charge carriers in it. Since the extension of the formed depletion zone depends on the applied voltage, a voltage dependency of the capacity results, which leads to an asymmetrical capacitance curve C(U) with a dependency on the applied voltage.

These adverse effects can be avoided by using electrodes made of a highly doped semiconductor material, or preferably made of metal.

Further, the capacitor should have a high area capacity to keep the area consumption on a chip low, wherein variations of the area capacity occurring in the production of a capacitor should be low.

Typically, an integrated capacitor is produced on a chip together with active and passive devices. In a production process, a method is desirable where an integrated capacitor can be integrated into an existing integrated overall process with as little additional steps as possible. Thereby, the number of process steps is of special significance, since additional process steps always open up additional potential sources for generating additional waste in mass production. Therefore, it is to be demanded for any integrated overall process that for the production of different devices, such as a capacitor and an active device, as many production steps as possible are shared. With the increasing miniaturization of devices on a chip, the number of phototechnique steps is of special significance, since a slight misalignment in a phototechnique method makes the device to be produced inoperable. Especially, any additional phototechnique leads to a significant raise of production costs.

It is known that due to the above-mentioned requirement of a small number of additional steps, the electrodes of an integrated capacitor are formed by polysilicon layers, which are used in other areas of the chip for generating structures of other devices, wherein a phototechnique necessary for structuring the other devices is used for structuring the capacitor electrodes. In a known method, for example, an upper electrode of an integrated condensator is formed by structuring a deposited polysilicon layer, wherein the polysilicon layer is further used for forming the gates of the CMOS transistors.

However, the above-explained generation of the electrode has the disadvantage that the overall process predetermines the dopant concentration of the polysilicon layer. The typically used dopant concentrations of deposited layers used in active devices are not sufficient to obtain a voltage dependency of the characteristic curve C(U) of the capacitor, which is sufficient for a high quality behavior of the capacitor.

FIG. 1 shows a cross-section of a known integrated capacitor, wherein the doping of the capacitor electrodes is determined by the source/drain doping of the CMOS (NMOS) transistors. According to FIG. 1, a highly conductive area 112 is formed in a silicon substrate 110 as a first electrode of the capacitor. The highly conductive area 112 is doped with phosphor as dopant to a dopant concentration of $6 \times 10^{15}$ cm$^{-2}$ and electrically isolated from further areas of the substrate by an STI trench 114 (STI=shallow trench isolation). A first dielectric layer 116 of SiO$_2$ and a dielectric layer 118 of Si$_3$N$_4$ are formed on the highly conductive area 112. According to FIG. 1, the first dielectric layer of SiO$_2$ has a thickness of 4.6 nm, while the second dielectric layer of Si$_3$N$_4$ has a thickness of 12 nm. A conductive polysilicon layer 120 is arranged on the second dielectric layer 118 as a second electrode, which is further used in an area, not shown in FIG. 1, for forming an active device. The polysilicon layer 120 has a thickness of 250 nm and is doped by means of arsenic doping to a doping concentration of $5 \times 10^{15}$ cm$^{-2}$. Further layers 122 and 124, which are used for contacting the second electrode, are applied over the polysilicon layer 120.

Since the doping of the capacitor electrodes of the capacitor shown in FIG. 1 is predetermined by the doping steps in a CMOS transistor process, their doping can not be selected independently, so that with the existing dopant concentrations the curve of a capacitance across an applied voltage shows an unfavorable curve due to a depletion of charge carriers in polysilicon, as will be explained below.

FIG. 2 shows a diagram of a measured curve of the capacitor of FIG. 1 having a specific capacitance of C=3 fF/µm$^2$. In FIG. 2, an x-axis represents an applied voltage in Volt, while an y-axis represents a capacitance in nF.

As can be seen, the capacitance curve of the known capacitor of FIG. 1 is mainly constant in an area of +5 Volt to +3 Volt of a voltage applied between the second electrode of polysilicon and the first electrode, wherein the capacitance value is about 2.54 nF. With decreasing voltage at the second electrode of polysilicon, the capacitor curve shows in an area of +3 Volt to about −1 Volt a non-linear reduction of capacitance, which turns into a linear reduction with increasingly applied negative voltage at about −1 Volt, wherein the capacitance value is reduced from about 2.51 nF at −1 Volt to about 2.43 nF at −5 Volt. In this area, i.e. when the upper electrode of polysilicon is positive with respect to the lower electrode, a strong space-charge region is formed in polysilicon, whose size increases with increasingly applied negative voltage.

The characteristic curve of the capacitance curve shown in FIG. 2 is therefore highly asymmetrical and formed constant only in a small voltage area, which is why the capacitor of FIG. 1 is not suitable for the realization of a high-quality capacitor where a low voltage dependency of the capacitance is required. A known possibility to improve the voltage dependency caused by a strong depletion of the charge carriers in a polysilicon is to increase the dopant concentration of the polysilicon of the polysilicon layer 120 afterwards.

It is known that such an increase of the active charge carriers in the polysilicon layer 120 can be achieved by optimizing the temperature budget, whereby a small improvement of the capacitance curve can be achieved. However, a change of the temperature budget can only be carried out in a very tight area, since such a change has adverse influences on the functionality of the CMOS transistors generated in parallel to the capacitor.

Since the doping of the polysilicon layer 120 in the above-described integrated capacitor is not independent from the overall process and is performed more specifically by an implantation that at the same time performs a doping of the source/drain areas of the CMOS (NMOS) transistors, the doping of the polysilicon layer 120 in the above-described capacitor cannot be chosen too high, since a doping of the source/drain areas, which is too high, would lead to a breakthrough of the NMOS transistors.

It is known that improvements in the voltage dependency can be achieved by a post-doping of the arranged polysilicon layers. This can be performed, for example, by a post-ion implantation, which preferably comprises a phosphor implantation with n-conducting electrodes. However, the post-doping has the disadvantage that additional method steps, especially additional phototechnique steps, are necessary to carry out the post-implantation. As has been mentioned above, any additional phototechnique raises the costs of the overall process immensely.

Further, it is known to provide a storage capacitor and deep trench capacitor, respectively, as an integrated capacitor on the chip to obtain a favorable capacitance curve C(U). However, providing a storage capacitor has the disadvantage that for generating it a complex processing with additional process steps is required, which comprises generating the deep trench and a subsequent filling. These complex process steps again have an adverse effect on the waste in mass production. Further, a specific area capacity in a storage capacitor is only badly reproducible due to its complex arrangement in a trench, as compared to a prior art planar capacitor.

It is another known approach for generating an integrated capacitor with favorable capacitance curve to form the electrodes of the capacitors as metallic layers. In such a capacitor with metal electrodes, referred to as MIM capacitor, a very low voltage dependency of the capacitance curve results due to the high conductivity of the electrodes. However, the MIM capacitors have the disadvantage that the dielectric disposed between the metal electrodes has to be compatible with them, i.e. the deposition of the dielectrics can only be performed up to a temperature agreeable with the metal electrodes. The known dielectrics that fulfill this requirement have, however, a dielectric constant, which is lower than the one of known dielectrics that can be used for polysilicon layers. Consequently, the area capacity of a MIM capacitor is reduced in comparison to other types of integrated capacitors.

SUMMARY OF THE INVENTION

It is the object of the present invention to provide an improved method for providing an integrated capacitor with advantageous behavior.

The present invention provides a method for manufacturing a capacitor, the method including the following steps: providing a raw structure having a doped substrate and at least one dielectric layer, wherein a first area and a second area of the substrate are separated by an electrically isolating structure, the first area being arranged between first and second isolation areas of the isolating structure, the doped substrate in the first area representing a first capacitor electrode of the capacitor; applying an electrically conductive layer on the at least one dielectric layer above the first and the second area; applying a mask layer on the electrically conductive layer and patterning same for forming a mask above the first area; etching away the electrically conductive layer and at least one of the at least one dielectric layer in the second area by means of the mask, so that the electrically conductive layer and the at least one dielectric layer are removed outside the first area, whereby in the first area, a second capacitor electrode is formed from the conductive layer, and a patterned capacitor dielectric layer is formed from the dielectric layer; and completing an active device in the second area.

The present invention is based on the knowledge that an improved method for producing a capacitor is obtained when an upper electrode of the capacitor comprises a conductive layer, which is formed after structuring nearly in one capacitor area, wherein in the inventive structuring a mask is used, which will subsequently also be used for structuring the dielectric of the capacitor. The inventive method, where the generation of the upper electrode by the inventive structuring of it is decoupled from a generation of further active elements in areas outside the capacitor area, makes it possible that the conductive layer can be arranged with a desired conductivity without interfering with the generation of the active elements, wherein, however, no additional phototechnique is required, since the mask for structuring the conductive layer is also used for structuring the dielectric.

The present invention has the advantage that by generating the conductive layer with a high conductivity a capacitor integrated on a chip can be generated, which has a low dependency of the capacity on an applied voltage, without influencing other active elements disposed on the chip.

Particularly, in an embodiment where the conductive layer is formed of a metal, a very good behavior of the capacitor with low voltage dependency of the capacitance can be obtained.

Further, the present invention has the advantage that by removing the conductive layer in areas outside the capacitor area an increase of structures in them is avoided.

Removing the conductive layer outside the capacitor area further enables an integration of the method into an existing production method for generating an integrated capacitor and integrated active elements in parallel without needing additional phototechnique steps.

In one embodiment, the conductive layer can further comprise a highly doped polysilicon layer, whereby a dielectric with high dielectric constant can be chosen for the dielectric layer, so that the generated capacitor has a high area capacitance with simultaneous good behavior.

BRIEF DESCRIPTION OF THE DRAWINGS

Preferred embodiments of the present invention will be discussed in more detail below with reference to the accompanying drawings. They show:

FIG. 3–17 schematical cross-sectional views for illustrating process steps for producing a capacitor according to a first embodiment of the present invention;

FIG. 18–19 schematical cross-sectional views for illustrating process steps for producing a capacitor according to a second embodiment of the present invention; and FIG. 20–23 schematical cross-sectional views for illustrating process steps for producing a capacitor according to a third embodiment of the present invention.

DESCRIPTION OF PREFERRED EMBODIMENTS

Figure 1:
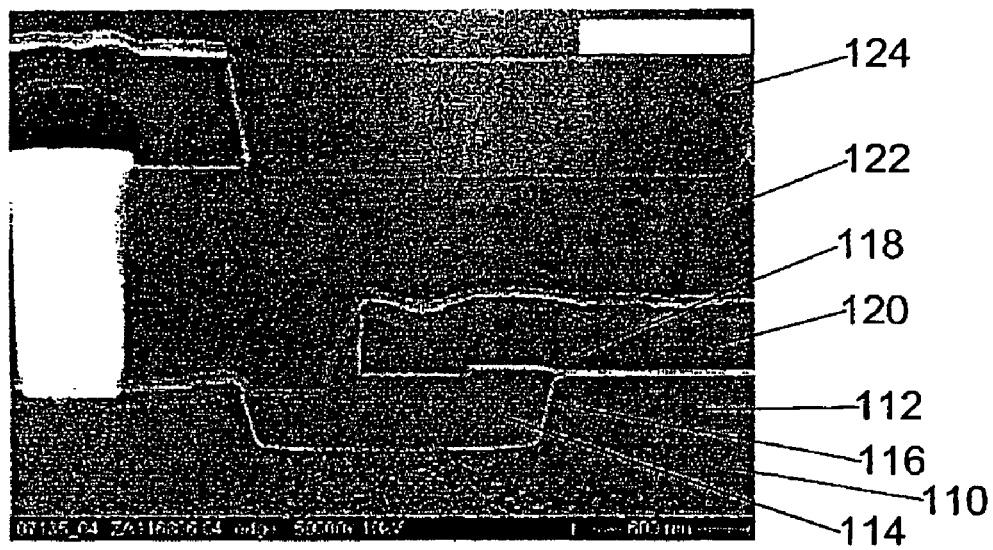
FIG. 1 a cross-section of a known integrated capacitor.
Figure 2:
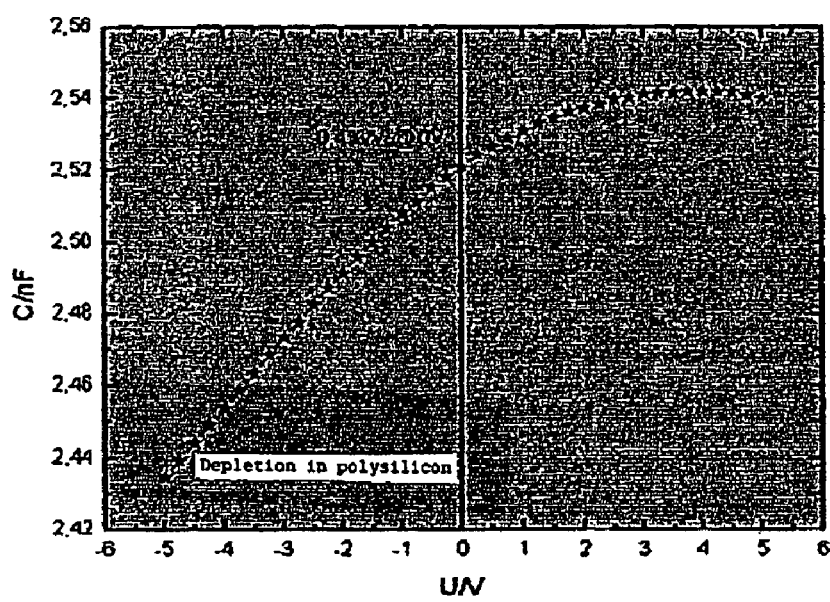
FIG. 2 a capacitance curve of the known capacitor of FIG. 1 as function of an applied voltage.

With reference to FIG. 3–23, different embodiments of the present invention will be discussed below. The same reference numbers identify similar elements and areas in the Figures.

In the following Figures, cross-sectional views are shown, comprising a section of a substrate 210. In the shown section, a capacitor area is illustrated, wherein a capacitor is formed by the inventive method. Further, portions of areas are illustrated that are adjacent to the capacitor area. Although it is not shown in the Figures, the substrate further comprises further portions or areas where other devices, such as a MOS transistor or a bipolar transistor, are formed.

In the following, a first embodiment will be explained with reference to FIG. 3–17. FIG. 3 shows a semiconductor structure after performing production steps in which, at first, three STI isolation areas (STI=shallow trench isolation) are formed in a semiconductor substrate 210 of silicon on a surface 210a. The silicon substrate 210 has a high dopant concentration in areas where the STI isolations area 212, 214, 216 are not formed, wherein the doping of the at first undoped substrate 210 is performed by an implantation of phosphor as dopant across the surface 210a, after STI isolation areas have been generated. Under-diffused areas 218, 220 and 222 with low conductivity, which are created by a lateral diffusion of the dopant during implantation are formed in areas below the STI isolation areas 212, 214 and 216. The STI isolation areas 212 and 214 define a capacitor area wherein an integrated capacitor is formed by the inventive method. The capacitor area comprises an area between the STI isolation areas 212 and 214. The capacitor area is electrically isolated from adjacent areas of the substrate by the STI isolation areas 212, 214.

Although, in the described embodiments, merely an electric isolation of substrate areas by STI isolation areas is shown, other electrical isolations of substrate areas can be provided in other embodiments. Further, the doping of the substrate is not limited to the described ion implantation after generating the electrical isolation. The substrate can, for example, be doped overall by any known doping technique, wherein an electrical isolation of substrate areas is obtained, for example, by a deep trench isolation.

FIG. 4 shows the structure of FIG. 3 after the overall arranging of a first dielectric layer 224 of $Si_3N_4$, wherein it is arranged on the surface 210a of the substrate 210 with a thickness of about 4–6 nm.

With reference to FIG. 5, starting from the structure of FIG. 4, on the first dielectric layer 224 a second dielectric layer 226 is arranged overall on the first dielectric layer 224. In the described embodiment, the second dielectric layer 226 comprises $SiO_2$, generated by a reoxidation. The total thickness of the structure comprising the first and second dielectric layers is about 5–7 nm. Alternatively, instead of the described two dielectric layers, in other embodiments merely one dielectric layer can be arranged on the surface 210a of the substrate 210 as capacitor dielectric, wherein the layer is further not limited to the described dielectrics $Si_3N_4$ and $SiO_2$, and can comprise any known dielectric. Also, instead of the dielectric layers 224 and 226, a layer structure with more than two dielectric layers and sheets, respectively, can be arranged, wherein the layer structure can comprise any possible combination of known dielectrics.

With reference to FIG. 6, a conductive layer 228 is arranged overall on the second dielectric layer 226 in the structure shown in FIG. 5. In a preferred embodiment, the conductive layer 228 comprises polysilicon, which is preferably strongly doped with phosphor. Typical dopant concentrations comprise an area of $1 \times 10^{20}$ cm$^{-3}$ to $4 \times 10^{20}$ cm$^{-3}$. Arranging the conductive layer 228 can be performed by any known method, such as by a low-pressure chemical vapor deposition, LPCVD. Preferably, the conductive layer has a thickness of about 100 nm and is n-doped with phosphor as dopant in the described embodiment. The doping can be performed by an in-situ method during the deposition of the layer, by doping from the gas phase, by an overall implantation or by any other known doping method.

In an alternative embodiment, the conductive layer 228 can be arranged as metallic layer, wherein the used metal is preferably resistant to high temperatures to avoid melting during subsequent method steps. The metallic layer can be arranged with any known method, such as a sputter method or vapor deposition.

The conductive layer 228 can be provided with any desired doping and conductivity, respectively. In other embodiments, the conductive layer 228 can further also comprise several layers with different materials and dopings.

As explained below, arranging the conductive layer 228 does not influences the formation of intended other devices, such as MOS transistors and bipolar transistors, in areas outside the capacitor area, since it is removed in a subsequent step in the areas outside the capacitor area prior to completing the devices.

FIG. 7 shows the structure of FIG. 6 after performing a photolithography step for generating a mask 230 for etching the conductive layer 228. Preferably, the mask 230 of TEOS material (TEOS=tetra ethyl ortho silicate) with a thickness of 30 nm is deposited on the conductive layer, and then structured to the mask 230 by means of known lithography techniques, such as a photolithography, and known etching methods, such as plasma etching. As can be seen in FIG. 6, the mask 230 extends after structuring in the area between the STI isolation areas 212, 214 and partly into the isolation areas 212 and 214, respectively, to structure the conductive layer 228 in a subsequent step such that it is only formed in the capacitor area.

Alternatively, the mask 230 can comprise other materials that are suited to perform structuring of the conductive layer 228 and at least the arranged second dielectric layer 226. The mask 230 can also comprise a layer structure with several layers comprising different materials.

In a subsequent step, the conductive layer 228 is removed by using the mask 230 in that area, which is not covered by the mask 230, so that a structured conductive layer is generated out of the conductive layer 228, which is only formed in the capacitor area. In one embodiment, where the conductive layer 228 is made of polysilicon, removing the conductive layer 228 outside the capacitor area is performed by known suitable etching techniques, such as by a plasma etching.

Preferably, for etching the conductive layer 228 an etching method can be used, wherein the second dielectric layer 226 acts as an etch stop to prevent further etching by the dielectric layers 224 and 226 into the substrate 210. To enable such selective etching, the etching method can be adapted to the dielectric layer 226 or, the other way round, the dielectric layer 226 can be chosen corresponding to the etching method.

FIG. 8 shows the structure of FIG. 7 after performing the etching step. The structured conductive layer 228, which is formed after the etching step only in the area below the mask 230, extends over the capacitor area, which comprises the area of the isolation area 212 to the isolation area 214.

In a subsequent step, etching the second dielectric layer 226 of $SiO_2$ is performed by using the layer 228 as mask 230. FIG. 9 shows the structure of FIG. 8 after performing this etching step. Corresponding to the structured conductive layer 228, the second dielectric layer 226 is formed in the capacitor area after performing the etching step, while the second dielectric layer 226 is removed in an area outside the capacitor area. Etching the second dielectric layer 226, which is formed of $SiO_2$ in the described embodiment, is performed preferably by an etching method, wherein the first dielectric layer 224 formed of $Si_3N_4$ in the described embodiment acts as an etch stop layer, so that an overetching into the substrate 210 is avoided. In the preferred embodiment, the mask 230 is removed by etching the second dielectric layer 226, wherein the structured conductive layer 228 is not etched, since it also acts as an etch stop layer in the etching method.

With reference to FIG. 10, the first dielectric layer 224 is etched away in an area outside the structured conductive layer 228 in a subsequent step. FIG. 10 shows the structure of FIG. 9 after performing this etching step. As can be seen in FIG. 10, the first dielectric layer 224 is structured after etching such that it extends corresponding to the second dielectric layer 226, only across the capacitor area. In the described embodiment, the structured conductive layer 228 of polysilicon is used as an etching mask for structuring the first dielectric layer 224 of $Si_3N_4$. In the same way, in etching the first dielectric layer 224 of $Si_3N_4$, the substrate 210 of silicon acts as an etch stop, so that overetching into the substrate 210 is avoided. Accordingly, by appropriately choosing the dielectric layer 224 of $Si_3N_4$ and the dielectric layer 226 of $Si_2O$, a selective etching is enabled in the described embodiment, wherein in etching the second dielectric layer 226 the first dielectric layer 224 acts as etch stop layer, and in etching the first dielectric layer 224, the structured conductive layer 228 and the substrate 210 act as an etch stop. The selective etching enables an accurate removal of the dielectric layers 224 and 226 without the danger of removing the structured conductive layer 228 and the substrate 210.

The present invention is not limited to the above-explained structuring and etching method to obtain the inventive structuring of the conductive layer 228 and the dielectric layers 224 and 226 by arranging and structuring only one mask 230. The arranged mask 230 can, for example, comprise several layers, wherein in etching procedures for structuring the conductive layer 228 and the dielectric layers 224 and 226 one of the layers is etched away at a time by using the layer below as etch stop.

After the above-described etching, a cleaning is performed to remove any spurious remains and contaminations. In subsequent steps, process steps for generating one or several CMOS transistors and/or one or several bipolar transistors are performed in an MOS-area in a bipolar area outside the capacitor area, wherein the bipolar transistor is not shown in the illustrations of FIG. 1–23. As it is explained below, certain process steps for generating the active elements, such as arranging layers or masks, doping or structuring, are performed in parallel in the capacitor area to generate an electrical connection to the structured conductive layer 228. Thereby, different process steps of the process curve can be used in different embodiments in the capacitor area for generating terminals or other structures.

First, p- and n-wells for the electrical isolation of subsequently generated source/drain areas are formed in the MOS-area by using known techniques, comprising lithography techniques and doping techniques. Then, RF cleaning cleans the surface of the structure and an oxide layer 232 is formed on the surface of the structure. In the MOS-area, the oxide layer 232 serves, after being structured, as a gate oxide layer and is formed by known techniques for generating gate oxide layers.

Figure 11:
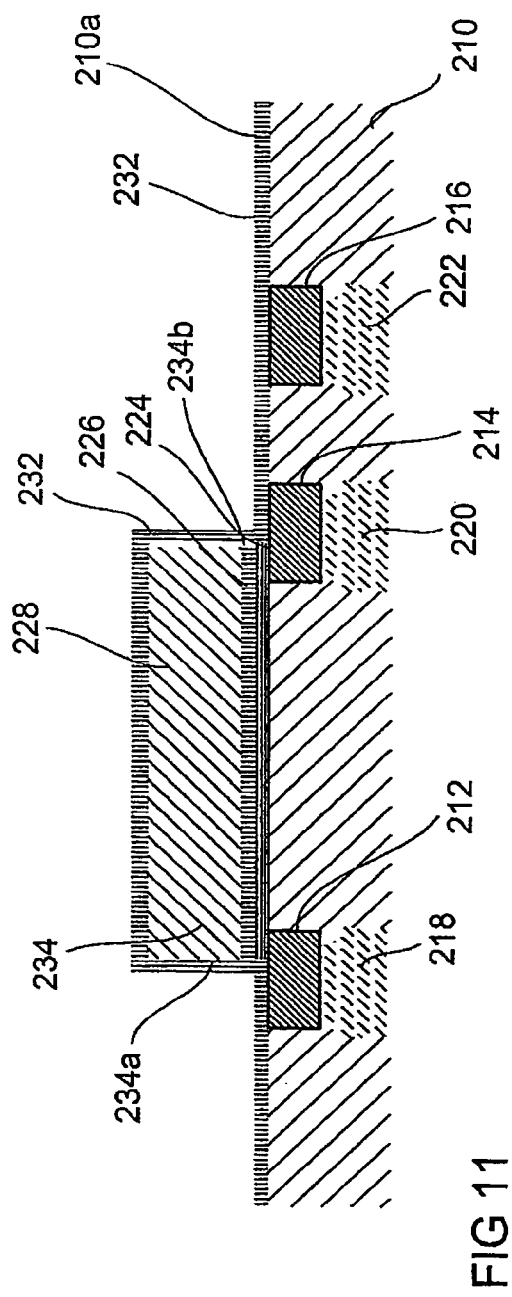

FIG. 11 shows the structure of FIG. 10 after forming the oxide layer 232. In an area outside a capacitor structure 234 defined by the structured layers 224, 226 and 228, the oxide layer 232 extends on the surface 210a of the silicon substrate 210. Further, the oxide layer 232 extends on the structured conductive layer 228 as well as on side faces 234a and 234b of the capacitor structure 234.

Figure 12:
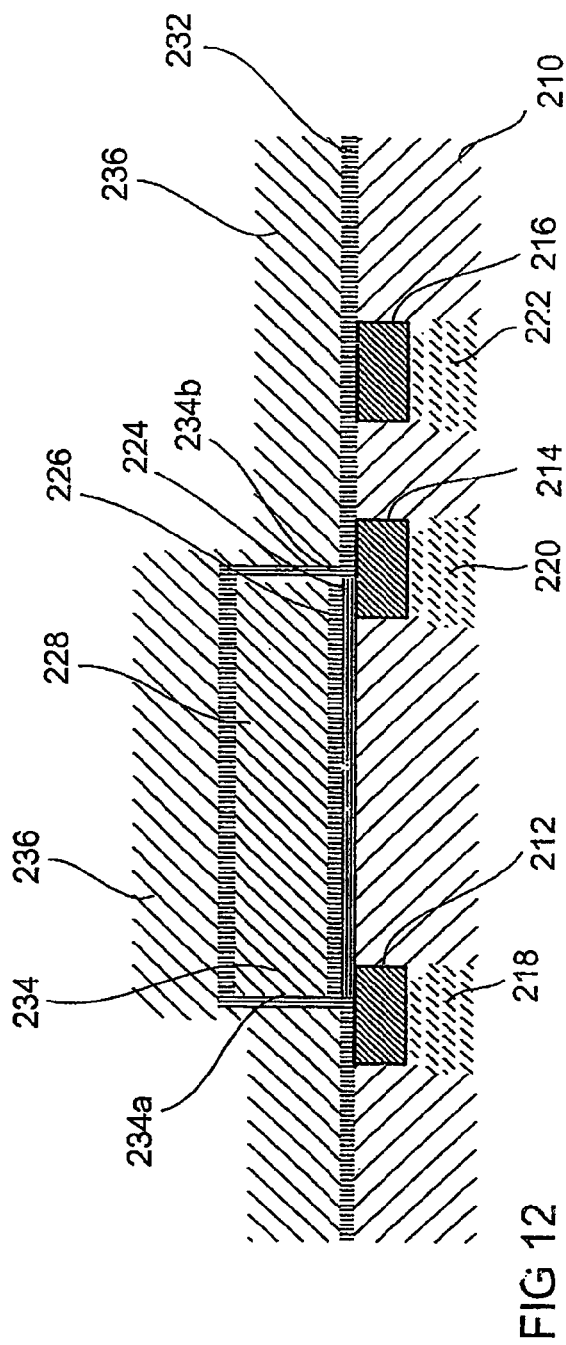

With reference to FIG. 12, then, in the first embodiment, a polysilicon layer 236 is arranged on the oxide layer 232, wherein the polysilicon layer 236 is further arranged in the MOS-area for forming a gate electrode. FIG. 12 shows the structure illustrated in FIG. 11 after arranging the polysilicon layer 236. Arranging the polysilicon layer 236 can be performed with any suitable method, such as LPCVD method. Preferably, the polysilicon layer 236 will be arranged undoped and doped by means of ion implantation in a later doping step, which determines a doping of source and drain areas of the MOS transistors in the MOS-area. In a subsequent step, a structuring of the polysilicon layer 236 is performed. Therefore, a masking layer (not shown) is applied and structured by means of known phototechnique and etching methods. The structuring is performed analogue to the structuring of a bipolar transistor in a bipolar area of the substrate, wherein the bipolar transistor is not shown in the illustrations of FIG. 1–23.

The structured mask in the capacitor area will then be used to remove the polysilicon layer 236 formed on the structured conductive layer 228. By using a suited phototechnique, the polysilicon layer 236 is further partly removed in areas 236a and 236b that are adjacent to the side faces 234a and 234b of the capacitor structure.

Removing the polysilicon layer 236 is necessary to remove the oxide layer 232 on the surface of the structured conductive layer 228 in a subsequent step and to enable an electrical contact for the structured conductive layer 228. Further, when etching the oxide layer 232 by hydro fluoric acid, the oxide layer 232 formed on the side faces 234a and 234b of the capacitor structure 234 will be removed partly in the above etching step.

FIG. 13 shows the structure of FIG. 12 after performing the above-described steps. By the processing that comprises etching the polysilicon layer 236 and the oxide layer 232, oxide layer areas 232a and 232b are formed, which extend starting from the oxide layer 232 disposed on the surface 210a partly along the areas 236a and 236b that are adjacent on the side of the capacitor structure 234. According to FIG. 13, the polysilicon layer 236 further extends in areas outside the capacitor area. Further, polysilicon layer areas 236a and 236b are formed on the side on the oxide layer areas 232a and 232b.

In a subsequent step, a second polysilicon layer 240 is deposited, which is provided in the bipolar area for forming a base terminal layer of polysilicon for a bipolar transistor provided there. FIG. 14 shows the structure of FIG. 13 after performing this step. As can be seen, the second polysilicon layer 240 is arranged overall on a surface of the structure of FIG. 13. The arranging is performed, for example, by LPCVD arranging, wherein the second polysilicon layer 240 has a thickness of 150 nm. Preferably, the second polysilicon layer 240 is arranged undoped, to be doped in a subsequent step by ion implantation.

In a subsequent step, etching the second polysilicon layer 240 is performed by using photolithography.

Figure 15:
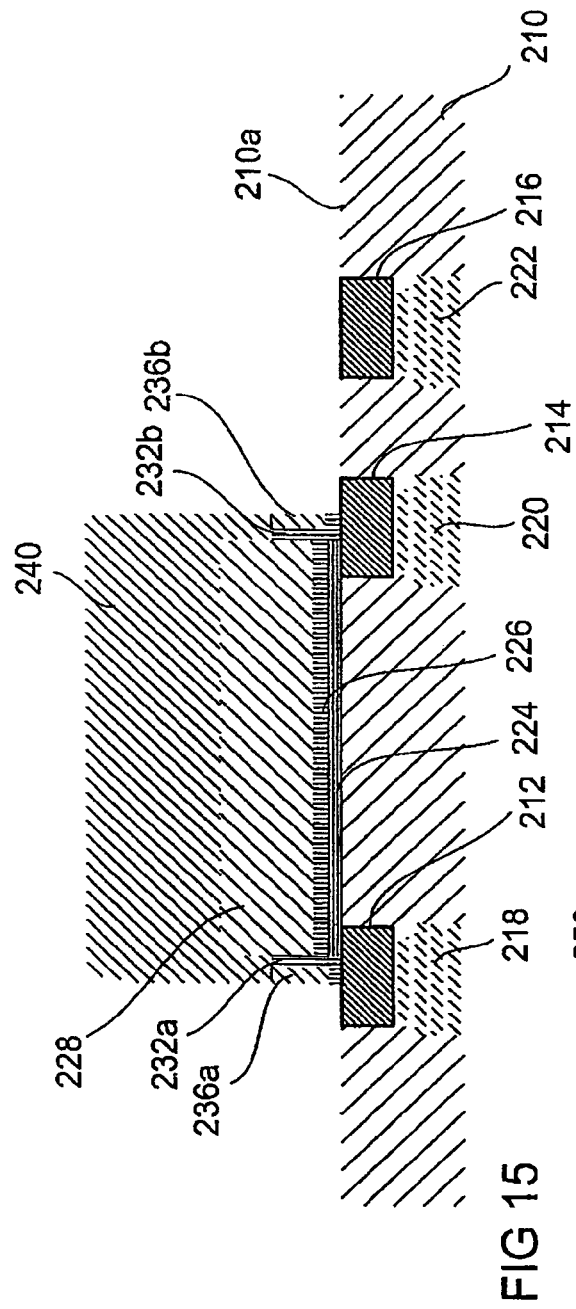

FIG. 15 shows the structure of FIG. 14 after performing the etching. As can be seen, the second polysilicon layer 240 remains on the conductive layer 228, as well as above the oxide layer areas 232a and 232b and the polysilicon layer areas 236a and 236b after the etching. Then, the oxide layer 232 arranged on the substrate is removed by an oxide etching in areas where the second polysilicon layer 240 is removed. Then, cleaning will be performed to remove photoresist remains arranged in photolithography as well as other possible contaminations.

In a subsequent step, a structuring of the CMOS transistors in the MOS-area and a structuring of the bipolar transistors in the bipolar area will be performed.

Figure 16:
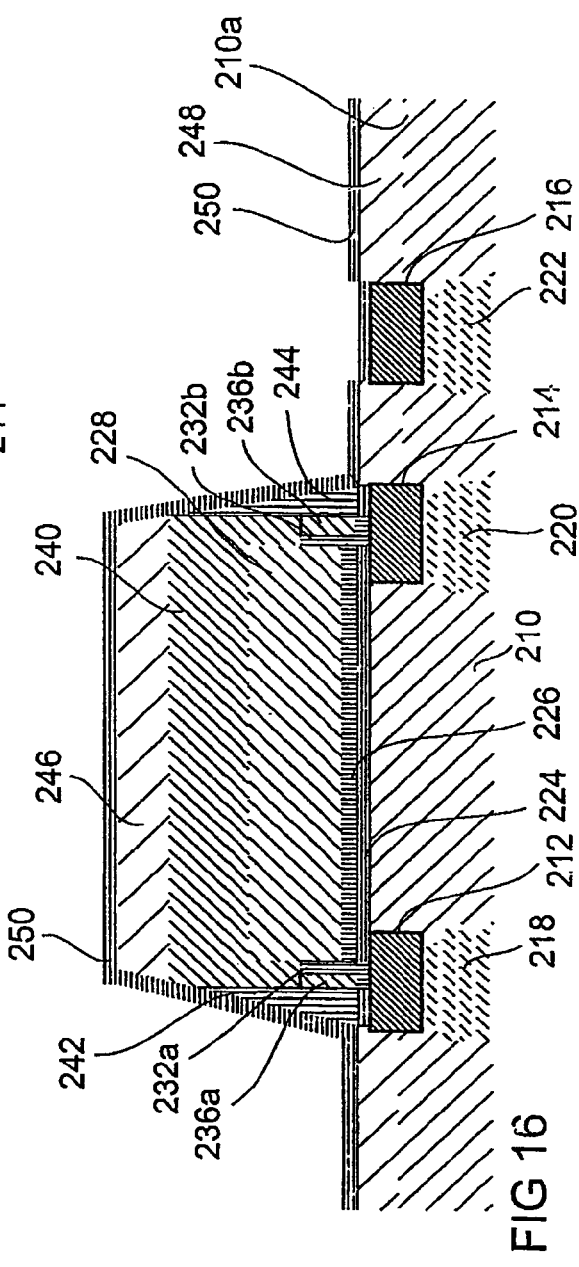

FIG. 16 shows the structure of FIG. 15 after performing the CMOS structuring steps. Due to the processing for structuring the transistors, starting from the structure of FIG. 15, spacers 242 and 244 are formed in the capacitor area, which are disposed on the side of the structured second polysilicon layer 240, wherein the structured second polysilicon layer is etched to a lower thickness. The spacers 242 and 244 are designed approximately triangular and consist of $SiO_2$. Then, for generating a good electrical contact, a metal silicide layer 246 is formed on the structured second polysilicon layer 240, and a metal silicide layer 248 is formed in the areas of the substrate 210 where no STI isolation areas are formed. Forming the metal silicide layers 246 and 248 is performed according to the known methods for forming metal silicide layers. Therefore, a metal, which preferably comprises titan, is deposited on the surface of the structured second polysilicon layer 240 and the surface 210a of the substrate 210, and in a subsequent siliconization process, the metal silicide layer is formed by means of a chemical reaction. With reference to FIG. 16, the metal silicide layer 246 is disposed on the structured second polysilicon layer 240, while the metal silicide layer 248 is formed on the surface 210a of the substrate 210 in the areas adjacent to the spacers 242 and 244. As can be seen in FIG. 16, the metal silicide layer 248 is not formed in those areas, where the STI isolation areas are disposed, to obtain an electrical isolation by the STI isolation areas. In a subsequent step, an isolating layer 250 of $Si_3N_4$ is deposited, so that it is arranged on the metal silicide layer 248, on the STI area 216, on the metal silicide layer 246 and on the side of the spacers 242 and 244.

FIG. 17 shows the structure of FIG. 16 after performing another step, wherein contact holes 252a, 252b, 252c and 252d are generated in the silicide layer 246. Further, at least one contact hole 254 that serves for contacting the substrate is generated in the metal silicide layer 248, which is arranged on the substrate. The contact holes 252a–d and 254 are formed by photolithography and a subsequent etching, wherein first the isolating layer 250 is removed in the areas defined by the photolithography and one or several recesses are etched into the respective silicide layer below, i.e. the silicide layer 246 and 248, respectively. In the structure shown in FIG. 17, the contact holes 252a–d ensure an electrical contact for subsequently inserted plugs from the conductive structured layer 228 to traces that are formed in upper levels in subsequent steps contact hole the second polysilicon layer 240 provided with a lighter doping and contact hole the silicide layer 246.

Consequently, a capacitor is generated by the structure shown in FIG. 17 formed according to a first embodiment, wherein the doped substrate 210 in the capacitor area represents a lower electrode of the capacitor, while the structured conductive layer 228 disposed above the structured layers 224 and 226 forms an upper electrode of the capacitor. Since the structured conductive layer 228 acting as upper electrode in the formed capacitor can be provided with a high doping without influencing other areas outside the capacitor area and without needing additional phototechnique steps, a high quality capacitor can be produced advantageously with the inventive method. Thereby, additional phototechnique steps are avoided by using the mask 230 both for structuring the conductive layer 228 and for structuring the second dielectric layer 226.

Further, the mask 230 is indirectly also used for structuring the first dielectric layer 224, since in the step of structuring the first dielectric layer 224, the structured conductive layer 228 that has been structured by the mask 230 is used as etching mask.

In the above-described first embodiment, due to the chosen processing, the second polysilicon layer 240 is formed over the structured conductive layer 228 and on the side of it, on which the silicide layer 246 is arranged. Providing the second polysilicon layer 240 has the advantage that the structured conductive layer 228 is protected from negative effects when generating the silicide layer 246 and when contact hole-etching it. When etching the contact holes 252a–252d, the arranged second polysilicon layer 240 offers a protection from possible overetching, so that in the case of overetching only the polysilicon layer 240 will be etched, while the conductive layer 228, which is important for the behavior of the capacitor, is protected from overetching.

Further, the polysilicon layer 240 generally offers an etch protection for the conductive layer 228 during the process, whereby possible thickness changes by etch ablations when arranging it do not have to be taken into consideration in this embodiment.

In the following, a second embodiment will be discussed, wherein a silicide layer for electrical contacting is arranged directly on the structured conductive layer 228, whereby a low ohmic resistance is achieved. In the second embodiment, the production steps explained with reference to FIG. 3–11 are performed identically to the first embodiment. Starting from the structure shown in FIG. 11, then no further polysilicon layers are deposited in the capacitor area in the subsequent parallel method steps for generating active devices in the MOS-area and in the bipolar area. If the conductive layer 228 is deposited as undoped semiconductor layer, then an annealing will be performed, preferably after ion implantation of the conductive layer 228, to obtain an equal distribution of the dopant material in the conductive layer 228.

In the second embodiment, starting from the structure shown in FIG. 11, first, the oxide layer 232 is removed on the substrate as well as on the structured conductive layer 228 and at the areas on the side of it. Then, a silicide layer 256 is formed on the structured conductive layer 228, and a silicide layer 258 is formed on the substrate by silicide layer generation. As in the first embodiment, the silicide layer 258 is merely formed in areas where the STI isolation 216 is not disposed, so that an electric isolation that is obtained by the STI isolation area 216 will not be bridged. Since in this embodiment a structured conductive layer 228 is present during parallel performed processes for generating the active devices without a protecting polysilicon layer arranged above it, in this embodiment ablations of the structured conductive layer 228 arise due to the processing, which occur, for example, in a step for generating spacers 260 and 262 that are disposed on the side of the structured layers 224, 226, 228 and 256. These ablations cause a reduction of the thickness of the structured conductive layer 228 during the further course of processing, so that when arranging the conductive layer 228, the thickness losses of the conductive layer 228 have to be taken into consideration. As it is further illustrated in FIG. 18, an isolating layer 264 of $Si_3N_4$ is deposited on the surface of the silicide layer 256 as well as on the side surfaces of the spacers 260 and on the surface 210a of the substrate 210.

FIG. 19 shows the structure illustrated in FIG. 18 after a subsequent step, wherein contact holes 266a–266d are etched in the silicide layer 256, and one contact hole 268 is etched in the silicide layer 258. Corresponding to the first embodiment, the areas provided for the contact holes are determined by means of photolithography, and in a subsequent etching, first the isolating layer 264 is removed in the defined areas, and then the contact holes 266a–266d are generated by etching recesses in the silicide layer 256. In the same way, the contact hole 268 is generated by etching a recess in the silicide layer 258.

With reference to FIG. 20–23, a third embodiment will be explained below, where the structured conductive layer 228 is partly etched away. In the third embodiment, the process steps described with reference to FIG. 3–11, will be performed identically to the first and the second embodiment. Starting from the figure shown in FIG. 11, the oxide layer 232 is etched away, except for the oxide layer areas 232a and 232b that remain on a side of the capacitor structure 234, respectively. Then, an isolating layer of $Si_3N_4$ is arranged, which is formed on the surface 210a of the substrate 210, on the conductive layer 228 and on the oxide layers 232a and 232b disposed on the side of the structured conductive layer 228. In a subsequent step, a TEOS layer 272 is arranged overall, so that it is formed on the surface 210a of the substrate 210 as well as on the oxide layer 232, which is arranged on the structured conductive layer 228, as well as on the side of the isolating layer 270. In a subsequent structuring process, which is used in the bipolar area for structuring an emitter window, a window, in which the structured conductive layer 228 is partly removed, is defined in the capacitor area by an appropriate phototechnique. First, the TEOS layer 272 and the oxide layer 232 are removed by the formed window in the defined window area. Then, the structured conductive layer 228 is partly etched away, to generate a recess 274 in the conductive layer 228 in the window area.

Forming the recess 274 is performed by the emitter window etching performed in parallel in the bipolar area, wherein this etching is a fixed time etching. Since the conductive layer 228 in the above-described third embodiment is to be etched only to a certain thickness, it has to be arranged with a respective thickness, to avoid that the structured conductive layer 228 will be etched away fully in the fixed time etching. Then, a thickness of the structured conductive layer 228 remaining after etching has to be adjusted by the thickness of the arranged conductive layer 228, which preferably comprises 170 to 200 nm.

With reference to FIG. 21, starting from the structure of FIG. 20, a doped polysilicon layer 276 is formed for filling the recess 274. Further, the polysilicon layer 276 is arranged on the TEOS layer 272 on the side beyond the recess 274. The polysilicon layer 276 is formed in the deposition process, wherein a polysilicon layer for generating an emitter is deposited in the bipolar area. Thereby, the polysilicon layer 276 is formed by a structuring process comprising a phototechnique with subsequent etching, wherein the used phototechnique is used in the bipolar area to perform a structuring of the emitter. As can be seen in FIG. 21, L-shaped TEOS-areas 278 and 280 are formed on the side of the recess 274, respectively. These L-shaped TEOS-areas 278 and 280 are generated by processing for generating the bipolar transistor in the bipolar area. Also, a recess 282 is formed in the polysilicon layer 276 due to the processing for generating the bipolar transistor in the bipolar area.

With reference to FIG. 22, starting from the structure shown in FIG. 21, first the TEOS layer 272 is removed in the areas where the TEOS layer 272 is disposed on the surface 210a of the substrate 210. In a subsequent step, a metal silicide layer 284 is formed on the surface of the polysilicon layer 276, and a metal silicide layer 286 is formed on the substrate. 210. As in the previously described embodiments, the metal silicide layer 286 is not formed in the areas of the substrate, where the STI isolation areas, i.e. a STI isolation area 216, are formed. In a subsequent step, a recess 294 is formed in the silicide layer 284. Then, an isolating layer 288 of $Si_3N_4$ is arranged overall on the surface of the silicide layer 284, on the silicide layer 286 and on the STI isolation area 216 as well as on the side of layers 284, 278, 280, 282, 270 and 272. In a subsequent step, contact holes 290a–290d are generated in the silicide layer 284, and at least one contact hole 292 is generated in the silicide layer 286. According to FIG. 23, the contact holes 292b and 292c are disposed in the middle of the recess 294, whereby they extend through the silicide layer 286 into the polysilicon layer 278, due to the larger height of the polysilicon layers.

As can be seen in FIG. 23, in the above-described third embodiment, no spacer is formed on the side. This occurs since the process steps, which are used in the third embodiment starting from the structure shown in FIG. 11 for a further generation of terminal elements and other structures of the capacitor, comprise production steps for generating a bipolar transistor, wherein in those forming a spacer is avoided. Further, it should be noted in the third embodiment that due to the used production steps after etching the window for introducing the polysilicon layer 278, which is performed parallel to introducing the emitter polysilicon in the bipolar area, two subsequent implantation steps follow, i.e. the collector implantation and the base implantation of the bipolar transistor. Thereby, attention has to be paid that the dielectric layers 224 and 226 will not be damaged in the performed implantations.

Although the conductive layer 228 has a doped polysilicon material in the described embodiments, the present invention is not limited thereto. Rather, the usage of any appropriate conductive layer, such as an arranged metallic layer, is provided in the present invention.

While this invention has been described in terms of several preferred embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

What is claimed is:

1. A method for manufacturing a capacitor, comprising:
   providing a raw structure having a doped substrate and at least one dielectric layer, wherein a first area and a second area of the substrate are separated by an electrically isolating structure, the first area being arranged between first and second isolation areas of the isolating structure, the doped substrate in the first area representing a first capacitor electrode of the capacitor, the at least one dielectric layer extending above the first and second areas of the substrate;
   applying an electrically conductive layer on the at least one dielectric layer extending above the first and the second areas;
   applying a mask layer on the electrically conductive layer and patterning the mask layer for forming a mask above the first area;
   etching away the electrically conductive layer and at least one of the at least one dielectric layer in the second area with the mask above the first area, so that the electrically conductive layer and the at least one dielectric layer are completely removed outside the first area, whereby in the first area, a second capacitor electrode is formed from the conductive layer, and a patterned capacitor dielectric layer is formed from the dielectric layer; and
   forming elements of an active device in the second area.

2. The method according to claim 1, wherein applying the electrically conductive layer further comprises applying the electrically conductive layer to a thickness of 80 nm to 120 nm.

3. The method according to claim 1, wherein the electrically conductive layer comprises a multi-sheet layer having a plurality of sheets with different materials.

4. The method according to claim 1, wherein the electrically conductive layer comprises at least one of the group consisting of a doped polysilicon layer and a metallic layer.

5. The method according to claim 4, wherein the step of applying an electrically conductive layer comprises applying an undoped polysilicon layer and doping the applied polysilicon layer.

6. The method according to claim 1, wherein the raw structure comprises a first dielectric area and a second dielectric layer, wherein the step of etching away at least one of the at least one dielectric layer in the second area further comprises the step of etching away the second dielectric layer in the second area with a first mask above the first area and using the first dielectric layer for stopping the etching.

7. The method according to claim 6, comprising the following steps between the step of etching away and the step of forming elements of the active device:
   removing the first mask; and
   etching away the first dielectric layer in the second area by using the electrically conductive layer.

8. The method according to claim 6, wherein the first dielectric layer comprises $Si_3N_4$, and the second dielectric layer comprises $SiO_2$.

9. The method according to claim 1, further comprising the following step after the step of etching away the electrically conductive layer:
   forming a contact structure above the electrically conductive layer.

10. The method according to claim 9, wherein the step of forming the contact structure above the electrically conductive layer comprises the following steps:
    forming a metal silicide layer; and
    forming contact holes in the metal silicide layer.

11. The method according to claim 1, wherein the active device is a bipolar transistor, and wherein forming elements of the active device includes:
    applying a polysilicon layer in the first and second areas; and
    applying a further mask layer on the polysilicon layer and patterning the further mask layer for defining a further mask above the first area and a base mask within a base area of the bipolar transistor; and
    etching away an unmasked portion of the first and second areas.

12. The method according to claim 1, wherein the active device is a bipolar transistor, and wherein forming elements of the active element includes:
    applying a second mask layer and patterning the same for defining a first window within the first area, which extends partly over the electrically conductive layer, and a second window within an emitter area of the bipolar transistor;
    partly etching away the electrically conductive layer and the emitter area using the second mask layer;
    applying a polysilicon layer;
    applying a third mask layer and patterning the third mask layer for forming a further mask substantially above the first area and above the emitter area; and
    etching away an unmasked portion of the polysilicon layer.

13. The method according to claim 12, wherein the electrically conductive layer has a thickness of 170 nm to 200 nm.

14. A method for manufacturing a capacitor, comprising:
    providing a first structure having a doped substrate and at least one dielectric layer, wherein a first area and a second area of the substrate are separated by an electrically isolating structure, the first area being arranged between first and second isolation areas of the isolating structure, the dielectric layer extending over the first and second areas;
    forming an electrically conductive layer on the at least one dielectric layer extending above the first area and the second area;
    disposing a mask layer on the electrically conductive layer and patterning the mask layer such that a mask is formed above only the first area;
    etching away an unmasked portion of the electrically conductive layer and an unmasked portion of at least one of the at least one dielectric layer in the second area such that the electrically conductive layer and at least one of the at least one dielectric layer is are completely removed outside the first area; and forming elements of an active device in the second area.

15. The method according to claim 14, wherein forming the electrically conductive layer further comprises forming the electrically conductive layer to have a thickness of 80 nm to 120 nm.

16. The method according to claim 14, wherein the electrically conductive layer comprises a multi-sheet layer having a plurality of sheets with different materials.

17. The method according to claim 14, wherein the electrically conductive layer comprises at least one of the group consisting of a doped polysilicon layer and a metallic layer.

18. The method according to claim 17, wherein the step of applying an electrically conductive layer comprises applying an undoped polysilicon layer and doping the applied polysilicon layer.

19. The method according to claim 14, wherein the first structure comprises a first dielectric area and a second dielectric layer, wherein the step of etching away the unmasked portion of the at least one dielectric layer in the second area further comprises the step of etching away unmasked portions of the second dielectric layer using the first dielectric layer for stopping the etching.

20. The method according to claim 19, comprising the following steps between the step of etching away and the step of forming elements of the active device:
  removing the mask layer; and
  etching away the first dielectric layer in the second area by using the electrically conductive layer as a masking element.

21. A method for manufacturing a capacitor, comprising:
  providing a raw structure having a doped substrate and at least one dielectric layer, wherein a first area and a second area of the substrate are separated by an electrically isolating structure, the first area being arranged between first and second isolation areas of the isolating structure, the doped substrate in the first area representing a first capacitor electrode of the capacitor, the at least one dielectric layer extending above the first and second areas of the substrate;
  applying an electrically conductive layer on the at least one dielectric layer extending above the first and the second area, the electrically conductive layer comprising a multi-sheet layer, comprising several sheets with different materials;
  applying a mask layer on the electrically conductive layer and patterning the same for forming a mask above the first area;
  etching away the electrically conductive layer and at least one of the at least one dielectric layer in the second area by means of the mask, so that the electrically conductive layer and the at least one dielectric layer are removed outside the first area, whereby in the first area, a second capacitor electrode is formed from the conductive layer, and a patterned capacitor dielectric layer is formed from the dielectric layer; and
  completing an active device in the second area.

22. A method for manufacturing a capacitor, comprising:
  providing a raw structure having a doped substrate and a first and a second dielectric layer, wherein a first area and a second area of the substrate are separated by an electrically isolating structure, the first area being arranged between first and second isolation areas of the isolating structure, the doped substrate in the first area representing a first capacitor electrode of the capacitor, the first and the second dielectric layer extending above the first and second areas of the substrate;
  applying an electrically conductive layer on the second dielectric layer extending above the first and the second areas;
  applying a mask layer on the electrically conductive layer and patterning the same for forming a mask above the first area;
  etching away the second dielectric layer in the second area by means of the mask layer by using the first dielectric layer for stopping the etching, so that the electrically conductive layer and the at least one dielectric layer are removed outside the first area, whereby in the first area, a second capacitor electrode is formed from the conductive layer, and a patterned capacitor dielectric layer is formed from the dielectric layer; and
  completing an active device in the second area;
  wherein the step of etching away the second dielectric layer in the second area by means of the mask layer comprises the step of etching away the second dielectric layer in the second area by means of the mask layer by using the first dielectric layer for stopping the etching.

23. A method for manufacturing a capacitor, comprising:
  providing a raw structure having a doped substrate and at least one dielectric layer, wherein a first area and a second area of the substrate are separated by an electrically isolating structure, the first area being arranged between first and second isolation areas of the isolating structure, the doped substrate in the first area representing a first capacitor electrode of the capacitor, the at least one dielectric layer extending above the first and second areas of the substrate;
  applying an electrically conductive layer on the at least one dielectric layer extending above the first and the second areas;
  applying a mask layer on the electrically conductive layer and patterning the same for forming a mask above the first area;
  etching away the electrically conductive layer and at least one of the at least one dielectric layer in the second area by means of the mask, so that the electrically conductive layer and the at least one dielectric layer are removed outside the first area, whereby in the first area, a second capacitor electrode is formed from the conductive layer, and a patterned capacitor dielectric layer is formed from the dielectric layer;
  applying a polysilicon layer in the first and second areas;
  applying a further mask layer on the polysilicon layer and patterning the same for defining a further mask above the first area and a mask within a base area of the bipolar transistor;
  etching away an unmasked portion of the first and second areas; and
  completing an active device in the second area.

24. A method for manufacturing a capacitor, comprising:
  providing a first structure having a doped substrate and at least one dielectric layer, wherein a first area and a second area of the substrate are separated by an electrically isolating structure, the first area being arranged between first and second isolation areas of the isolating structure, the dielectric layer extending over the first and second areas;
  forming an electrically conductive layer on the at least one dielectric layer extending above the first area and the second area, the electrically conductive layer comprising a multi-sheet layer having a plurality of sheets with different materials;
disposing a mask layer on the electrically conductive layer and patterning the mask layer to form a mask above the first area;
etching away an unmasked portion of the electrically conductive layer and an unmasked portion of at least one of the at least one dielectric layer in the second area; and
forming elements of an active device in the second area.

25. A method for manufacturing a capacitor, comprising:
providing a first structure having a doped substrate and a first and a second dielectric layer, wherein a first area and a second area of the substrate are separated by an electrically isolating structure, the first area being arranged between first and second isolation areas of the isolating structure, the dielectric layers extending over the first and second areas;
forming an electrically conductive layer on the dielectric layers extending above the first area and the second areas;
disposing a mask layer on the electrically conductive layer and patterning the mask layer to form a mask above the first area;
etching away an unmasked portion of the electrically conductive layer and unmasked portions of the second dielectric layer using the first dielectric layer for stopping the etching; and
forming elements of an active device in the second area.

* * * * *